United States Patent [19]
Luk et al.

[11] Patent Number: 5,790,839
[45] Date of Patent: Aug. 4, 1998

[54] SYSTEM INTEGRATION OF DRAM MACROS AND LOGIC CORES IN A SINGLE CHIP ARCHITECTURE

[75] Inventors: Wing Kin Luk, Chappagua; Wei Hwang, Armonk, both of N.Y.

[73] Assignee: International Business Machines Corporation, Armonk, N.Y.

[21] Appl. No.: 770,364

[22] Filed: Dec. 20, 1996

[51] Int. Cl.[6] .................................. G06F 1/10; G06F 1/18
[52] U.S. Cl. .................... 395/556; 395/558; 395/750.01; 395/308
[58] Field of Search ........................ 395/555, 556, 395/558, 559, 800.33, 750.01, 750.06, 750.07, 308; 364/488–491

[56] References Cited

U.S. PATENT DOCUMENTS

| | | |
|---|---|---|
| 5,077,676 | 12/1991 | Johnson et al. ........................ 364/489 |
| 5,298,866 | 3/1994 | Kaplinsky ............................ 327/261 |
| 5,537,498 | 7/1996 | Bausman et al. .................. 327/293 X |

Primary Examiner—Thomas M. Heckler
Attorney, Agent, or Firm—Whitham, Curtis & Whitham; Robert P. Tassinari, Jr.

[57] ABSTRACT

A chip architecture standard merges dynamic random access memory (DRAM) macros and logic cores. The standard from merged DRAM and logic design provides the advantages of simplicity, high read and write access rates, lower power dissipation and noise suppression in system-on-chip designs. The architecture depends upon balanced clock distribution for its high performance and low clock skew to the DRAM macros and logic cores. Balanced wirings from output drivers of the control logic to corresponding inputs of the different DRAM macros minimize differences in address and control signal delays. Separated Vdd and Gnd power grids distribute power to the DRAM macros and the logic cores and incorporate decoupling capacitor arrays to provide noise suppression between the DRAM macros and logic and to minimize di/dt power supply fluctuations on chip performance.

10 Claims, 8 Drawing Sheets

SYSTEM INTEGRATION OF DRAM MACROS AND LOGIC CORES IN A SINGLE CHIP ARCHITECTURE

BACKGROUND OF THE INVENTION

1. Field of the Invention

The present invention generally relates to the architecture of logic and dynamic random access memory (DRAM) merged on a single integrated circuit (IC) chip and, more particularly, to a standardized single chip merged DRAM/logic architecture and floor plan that provides balanced wiring for critical path clock and control signals and simplifies the power grid distribution networks for DRAM macros and logic cores. The invention is particularly applicable to a unified media memory (UMM) engine which can sustain a high performance bandwidth on random access read or write traffic.

2. Background Description

There have been many attempts to put complex systems with millions of logic gates and memory cells on a single chip. Designing so many gates and memory macros on a single chip, however, presents a formidable challenge. In the current semiconductor industry environment, logic cores are developed on the basis of logic process technology, and DRAM macros are developed on the basis of DRAM process technology. The logic and DRAM technologies represent two very different approaches.

Combining custom designed, synthesis designed, and pre-designed logic cores and reusable DRAM macros which are based on drastically different ground rules is quite complex. Building a new system-on-chip product for the market urgently requires a new merged logic/DRAM technology.

The current conception of the basic system-on-chip design involves placing the logic cores or memory macros on the chip much the same way as off the shelf components are placed on printed circuit boards (PCBs), and then adding memory, random logic, and data path connections in order to create system level integration. Unfortunately, it is not that simple. Although working with existing logic cores or memory macros can provide fast turn around in design time, this approach still requires a great deal of interface work and custom design to fit the newly merged logic/DRAM technology on the chip. There are difficulties in technology mapping, such as transistor threshold and layers of metal, global simulation, verification, wire routing and chip integration when combining logic cores and DRAM macros in the conventional way. There must be switching noise decoupling capacitors between logic core and DRAM macros. Other problems such as clock skew, performance, power dissipation, random access data rate, synchronization of DRAM macros and logic cores, noise margin and packages can also become critical. Thus, floor plan, power and clock distributions, address, control data paths and input/output (I/O) bus design are major challenges for integrating systems onto a single chip.

SUMMARY OF THE INVENTION

It is therefore an object of the present invention to provide a specification for placing DRAM macros and logic cores on the same chip.

According to the invention, a specification for the architecture of a merged logic/DRAM subsystem on a single chip is provided. The chip consists of multi-bank synchronous DRAM (SDRAM) macros placed on upper and lower parts of the chip with logic cores in the central part of the chip between the upper and lower SDRAM macros. At least one phase locked loop (PLL) is placed on one side of the central portion of the chip to provide an on-chip system clock that is routed to the center of the chip and then buffered and fanned out through a balanced tree of inverters to drive the SDRAM macros and the global clock drivers. The main global clock drivers provide additional levels of buffering to generate the clock signal for the local clock drivers that are distributed over the entire chip using two or more thicker wire metal layers with specific width and thickness. On-chip system buses provide high speed data transfer between the SDRAM macros and the logic cores. The logic cores may be, for example, a wide bit-width data path computing engine, graphics engine, microprocessor core, or the like, depending on the specific application. Combined multiplexer and buffer circuits provide high speed bi-directional data transfer between the on-chip system buses and off chip devices through off chip I/O drivers. A separate power distribution grid for the SDRAM macros and logic cores include decoupling capacitor arrays, for the SDRAM macros and logic cores separately. Programmable wiring cell structures are provided to connect or open power grids between the SDRAM macros and between SDRAM macros and logic cores.

BRIEF DESCRIPTION OF THE DRAWINGS

The foregoing and other objects, aspects and advantages will be better understood from the following detailed description of a preferred embodiment of the invention with reference to the drawings, in which:

FIG. 4B is an enlarged view of a portion of

FIG. 4A showing in detail the balanced control and address lines according to the invention;

DETAILED DESCRIPTION OF A PREFERRED EMBODIMENT OF THE INVENTION

Figure 1:
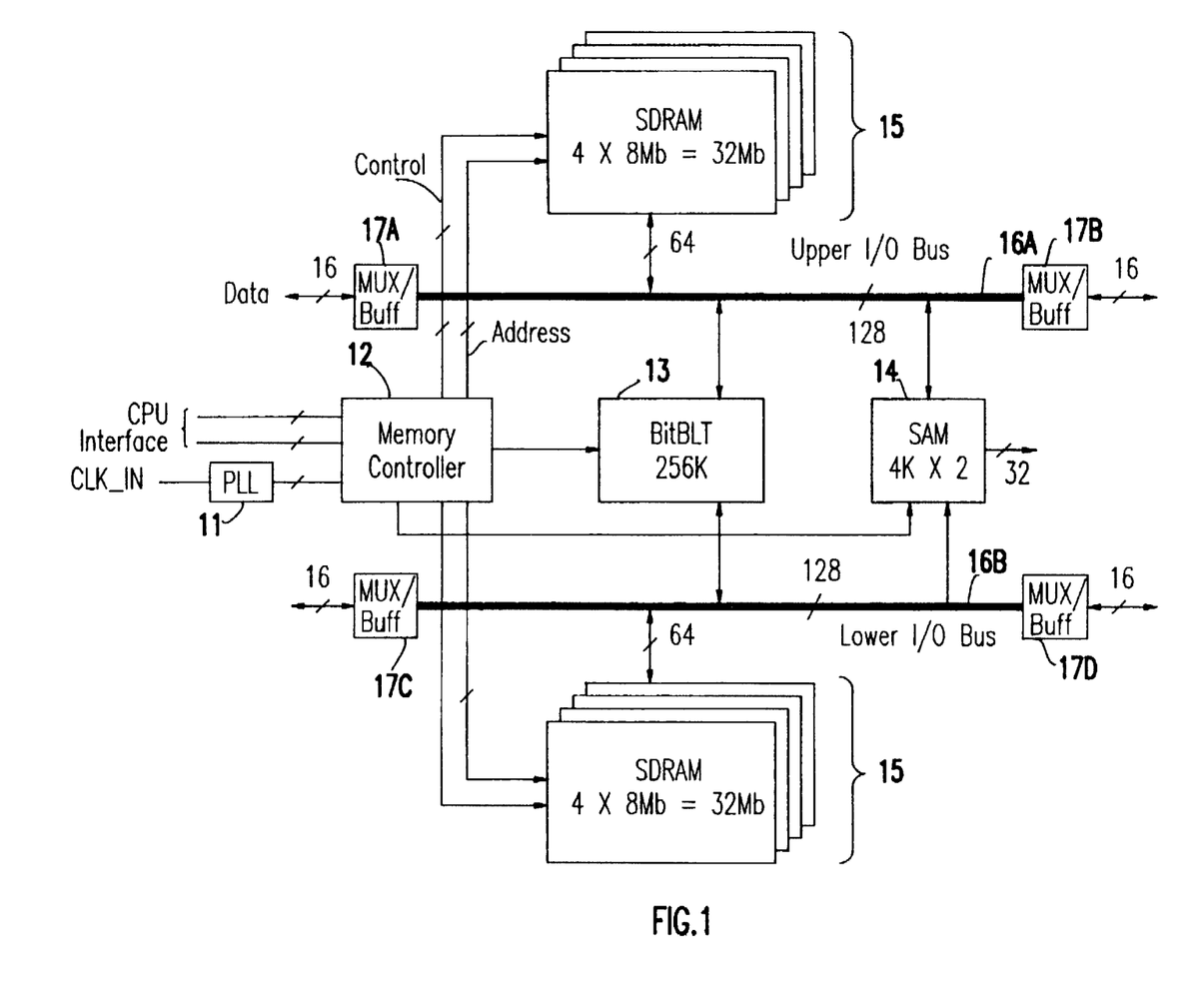
FIG. 1 is a block diagram of the architecture of one example of a merged DRAM/logic chip according to the invention.

Referring now to the drawings, and more particularly to FIG. 1, there is shown the architecture of merged logic/DRAM subsystem on a single chip. The particular architecture shown is for a unified media memory (UMM) chip as a merged DRAM and logic technology capable of sustaining high performance bandwidth on random access read and write traffic. It will be understood that this specific architecture is by way of example only and the techniques disclosed are useful in many high-performance system-on-chip designs.

The system shown in FIG. 1 includes a phase locked loop (PLL) clock 11, a gate array or standard cell random logic memory controller 12, a high bandwidth graphic engine 13 (denoted in FIG. 1 as BitBLT), a series access memory (SAM) 14, and a multi-bank 64 megabit (Mb) synchronous DRAM (SDRAM) 15. These logic cores and SDRAM macros communicate through high bandwidth 256-bit on-chip upper and lower data buses 16A and 16B. The gate array memory controller 12 provides all the control and address signals to the various SDRAM macros. Combined multiplexers and buffers (MUX/BUFF) 17A, 17B, 17C, and 17D are connected to either ends of the upper and lower data buses 16A and 16B for off-chip input/output (I/O) via off-chip drivers (as shown on the peripheral of the floor plan in FIGS. 5A and 5B). The PLL 11 provides on-chip clock generation networks.

Figure 2:
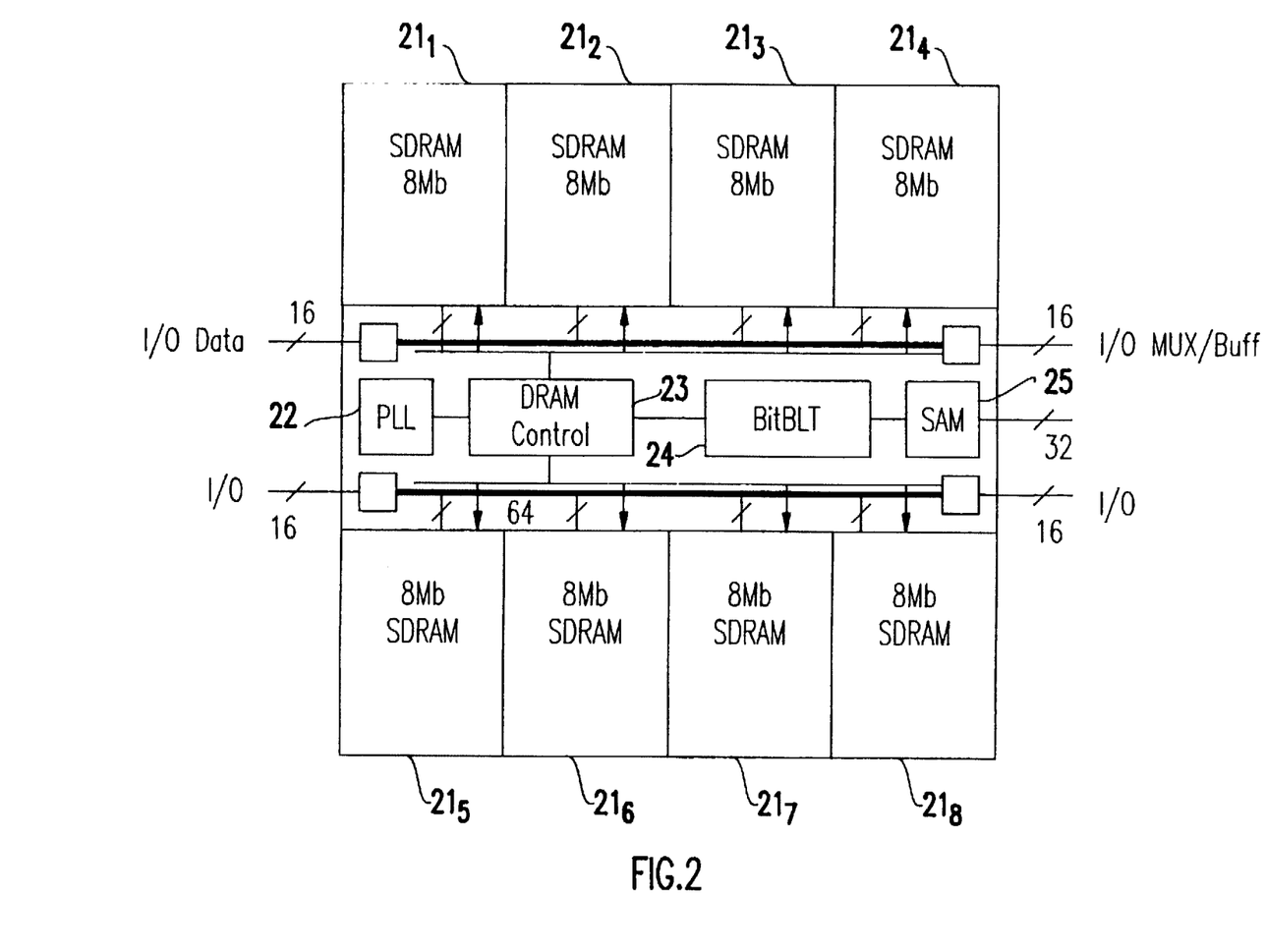
FIG. 2 is a block diagram of the floor plan of the chip for the merged DRAM/logic chip shown in FIG. 1.

The floor plan for the architecture of FIG. 1 is shown in FIG. 2. The SDRAM macros $21_1$ to $21_4$ and $21_5$ to $21_8$ are placed onto upper and lower parts of the chip, respectively, and the logic cores, comprising the PLL 22, DRAM controller 23, BitBLT engine 24 and SAM 25, are placed onto the central area of the chip between the upper and lower SDRAM macros. The PLL 22 is placed at the left hand side of central part of the chip to generate clock signals for the clock generation networks.

Figure 3:
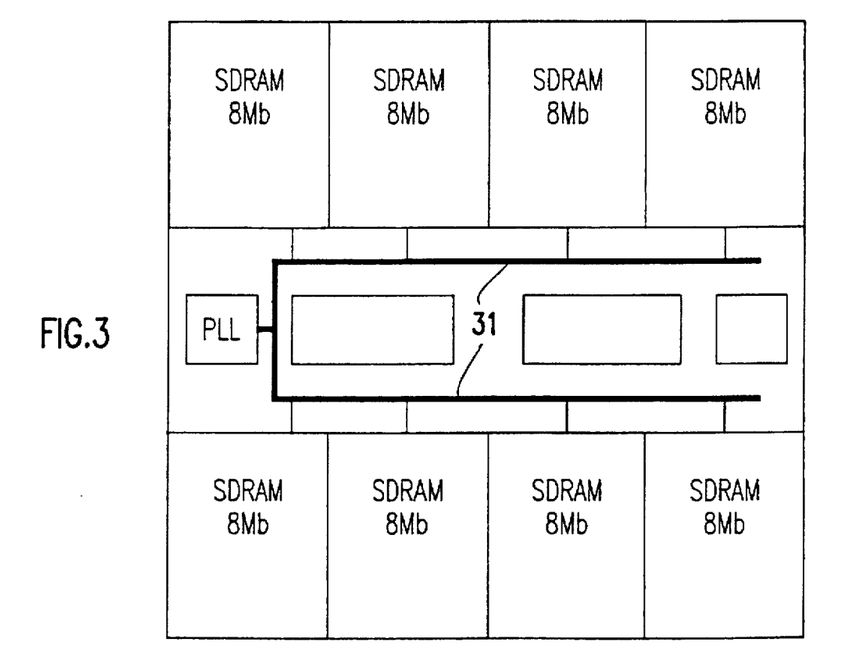
FIG. 3 is a block diagram of the floor plan shown in FIG. 2 modified to show a prior art approach to the clock network.

The clock routing is one of the most critical paths in the design. There are several ways to provide clock generation networks. The prior art clock networks were distributed as a U-loop. As applied to the floor plan of FIG. 2, this would result in the U-loop distribution system 31 shown in FIG. 3 to connect all of the eight SDRAM macros. The disadvantage of this approach is that the skew of the clock or signal degradation between the various SDRAM macros cannot be tolerated in this architecture, as SDRAM macro $21_1$ will get clock signal much sooner than that of SDRAM macro $21_4$, and similarly for SDRAM macros $21_5$ and $21_8$.

Figure 4A:
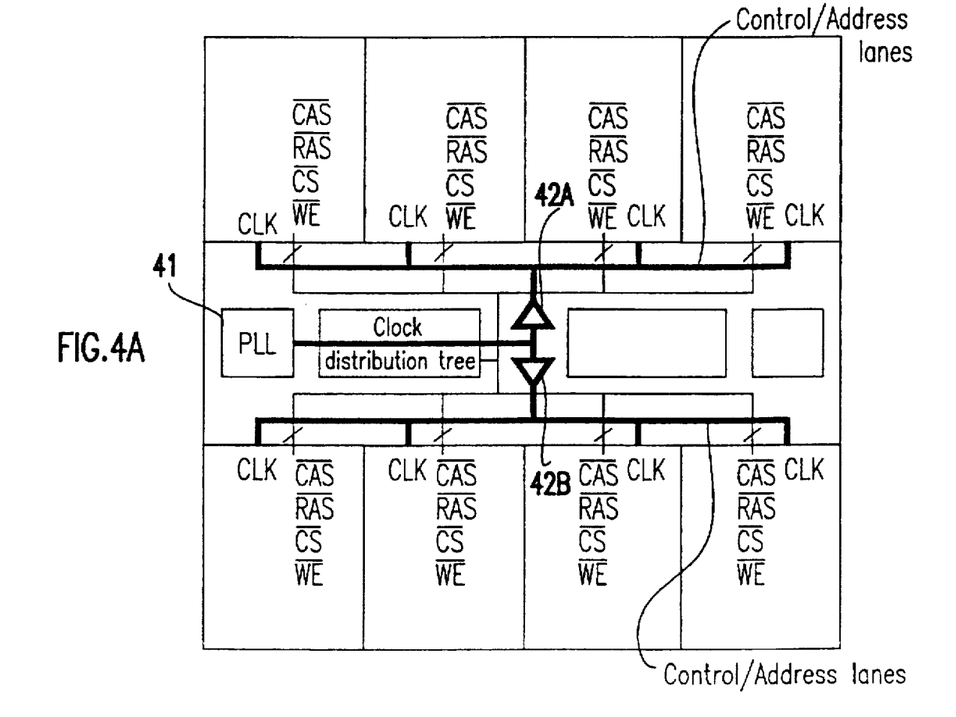
FIG. 4A is a block diagram of the floor plan shown in FIG. 2 showing the layout of the clock generation networks according to the invention.
Figure 4B:
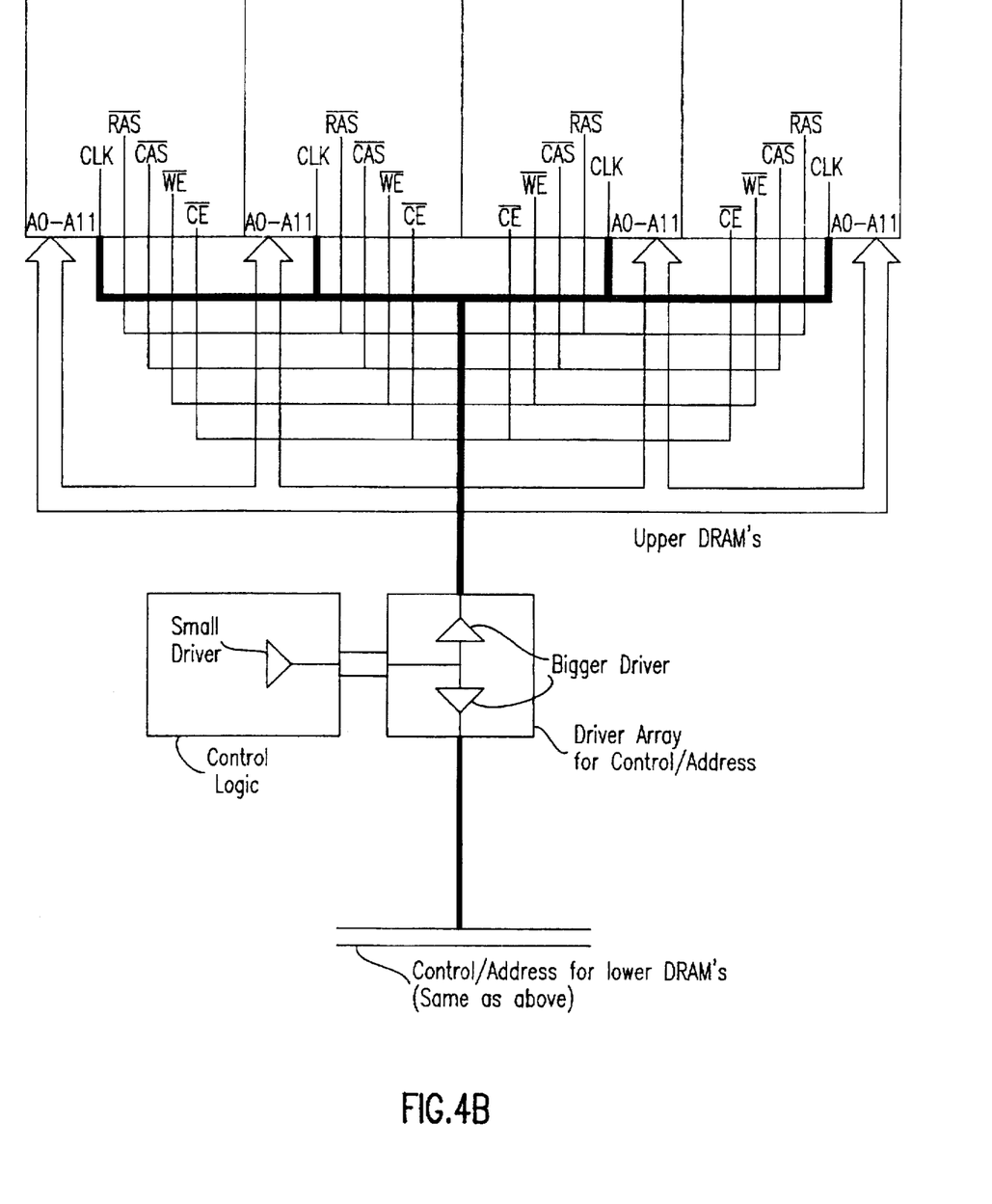

According to the present invention, as shown in FIG. 4A, an on-chip system clock from the PLL 41 is routed to the center of the chip (the main clock line), using thick and wide metal wire to minimize Resistance-Capacitance (RC) time delay, then buffered by buffers 42A and 42B and fanned out through a balanced tree of inverters (not shown) and clock wire, with specific width and thickness designed in a way to minimize RC time delay and clock skew to drive the SDRAM macros and the logic clock drivers. Preferably, wires will have a width of 300 to 1100 nm and a thickness of 200 to 1100 nm. Also, the main global clock drivers provide additional levels of buffering to generate the clock signals for the local clock drivers that are distributed over the entire chip using two or more metal layers. Similarly, as shown in FIG. 4B, each control signal is distributed evenly with even skew to each SDRAM macro. Each SDRAM macro receives a clock signal (CKE), a row access strobe (RAS), a column access strobe (CAS), write enable (WE) signal, and chip enable (CE) signal. All signals are distributed evenly to minimize skew. The control signals (CAS, RAS, CS, CKE), address decoder lines (A0–A12), and data buffer buses to all SDRAM macros are routed in the same manner as the clock balanced tree distribution. The symmetrical layout for the signals would be the same for the SDRAM cells on the lower part of the chip (not shown).

The symmetrical layout of the chip is a key component of the merged DRAM/logic specification according to the invention. Without symmetry, the clock may send signals in a synchronized manner, but some cells may get data earlier or later than others. The chip can only function as fast as the slowest component, so all memory cells should receive and store data at the same time.

Figure 5A:
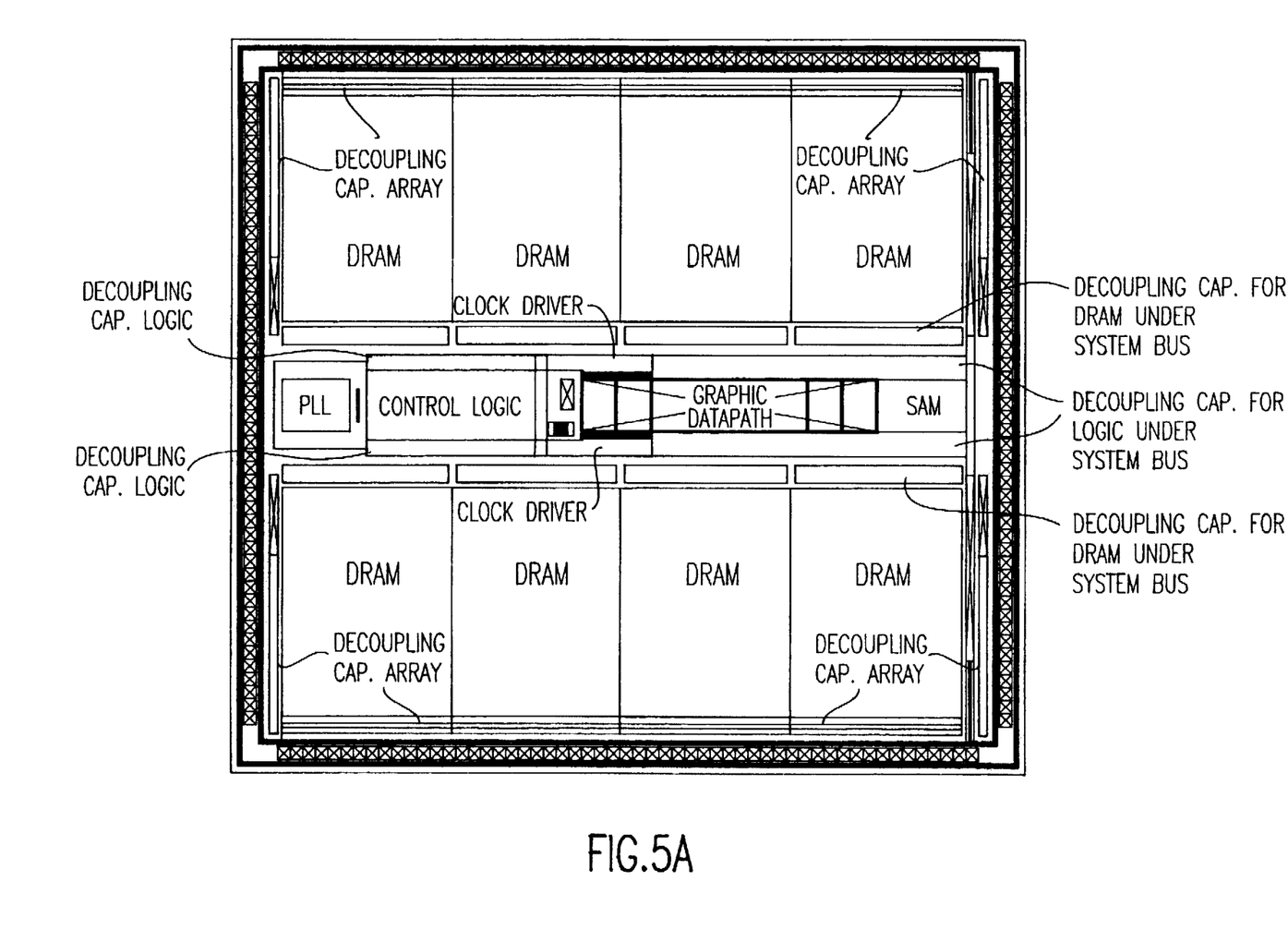
FIG. 5A is a top view of the chip floor plan as implemented showing drivers and decoupling capacitors, as well as the DRAM macros and the various logic macros.
Figure 5B:
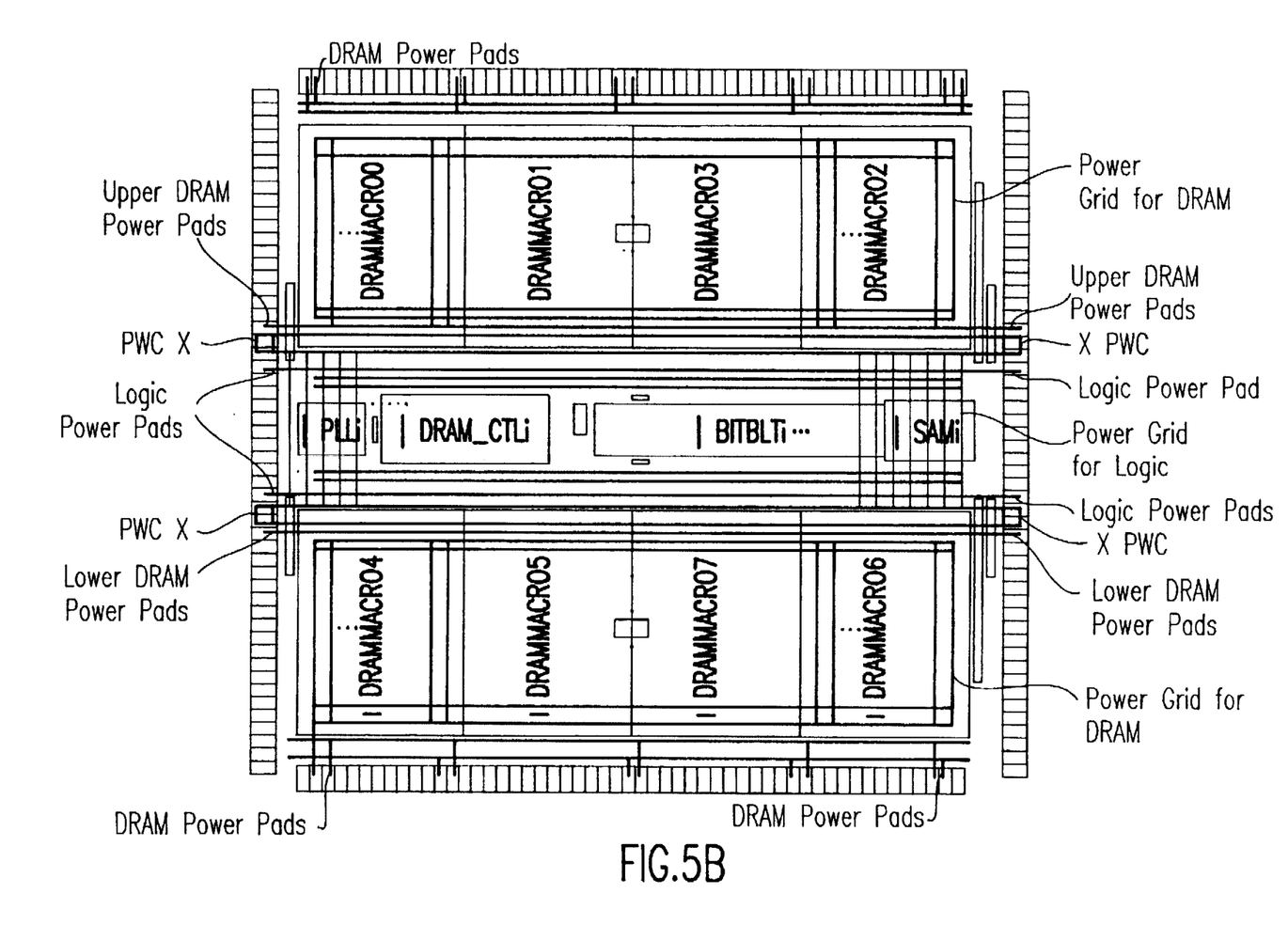
FIG. 5B is a top view of the chip floor plan as implemented showing the power grids for DRAM macros and logic cores.

The parallel data buses are placed between the SDRAM macros and logic cores at the central portion of the chip. Half of the data buses are placed between the logic cores and the upper SDRAMs and half between the logic cores and lower SDRAMs. The bits of databus are ordered in a way to minimize the effect of signal coupling between adjacent bits of the databus. This is shown in FIG. 5A for a specific implementation of the architecture being described. Here the locations of the decoupling capacitor arrays for the SDRAM macros and the decoupling capacitors for the logic cores are clearly shown. The decoupling capacitors provide a noise shield for the memory. Logic cores operate in a noisy environment which would interfere with the operation of the SDRAM. In addition, the decoupling capacitor arrays reduce the effect of power supply fluctuation (di/dt) on chip performance. The decoupling capacitor arrays are added under the system bus areas or other device free area in a way not to increase chip area requirements and degrade system performance. The basic cell for the decoupling capacitor arrays can be constructed using either the gate to drain and gate to source of planar transistor cells or trench capacitor cells in conventional DRAM technology. The orthogonal power grid (Vdd and Gnd) distribution for the SDRAM macros and logic cores are separated. The Vdd and Gnd horizontal and vertical lines are interleaved with each other as shown in FIG. 5B, using two or more thick and wide metal layers. There is also a separate Vdd power supply for the PLL.

Figure 6A:
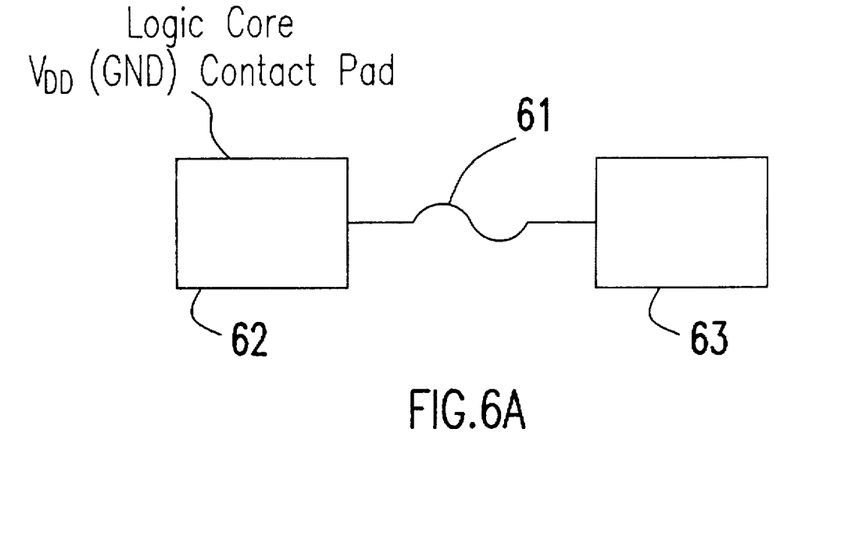
FIGS. 6A and 6B are schematic diagrams showing examples of connection types which may be used a controllable power pad connections.
Figure 6B:
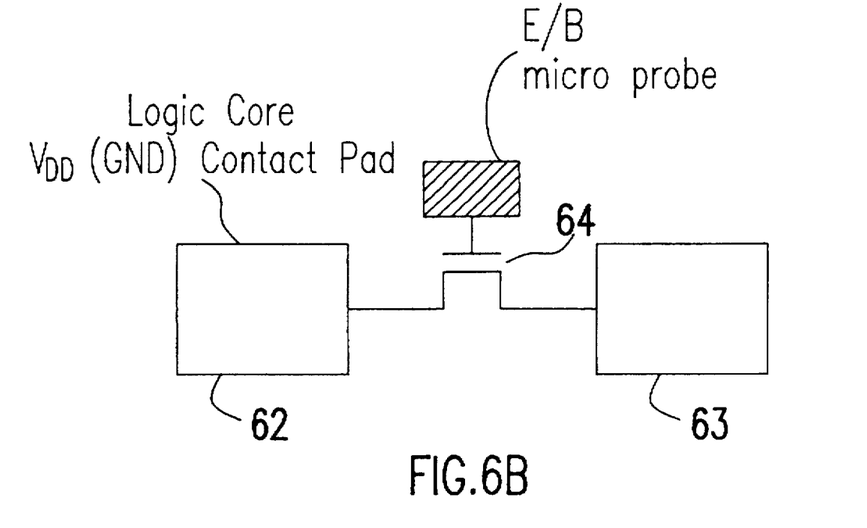
Figure 7:
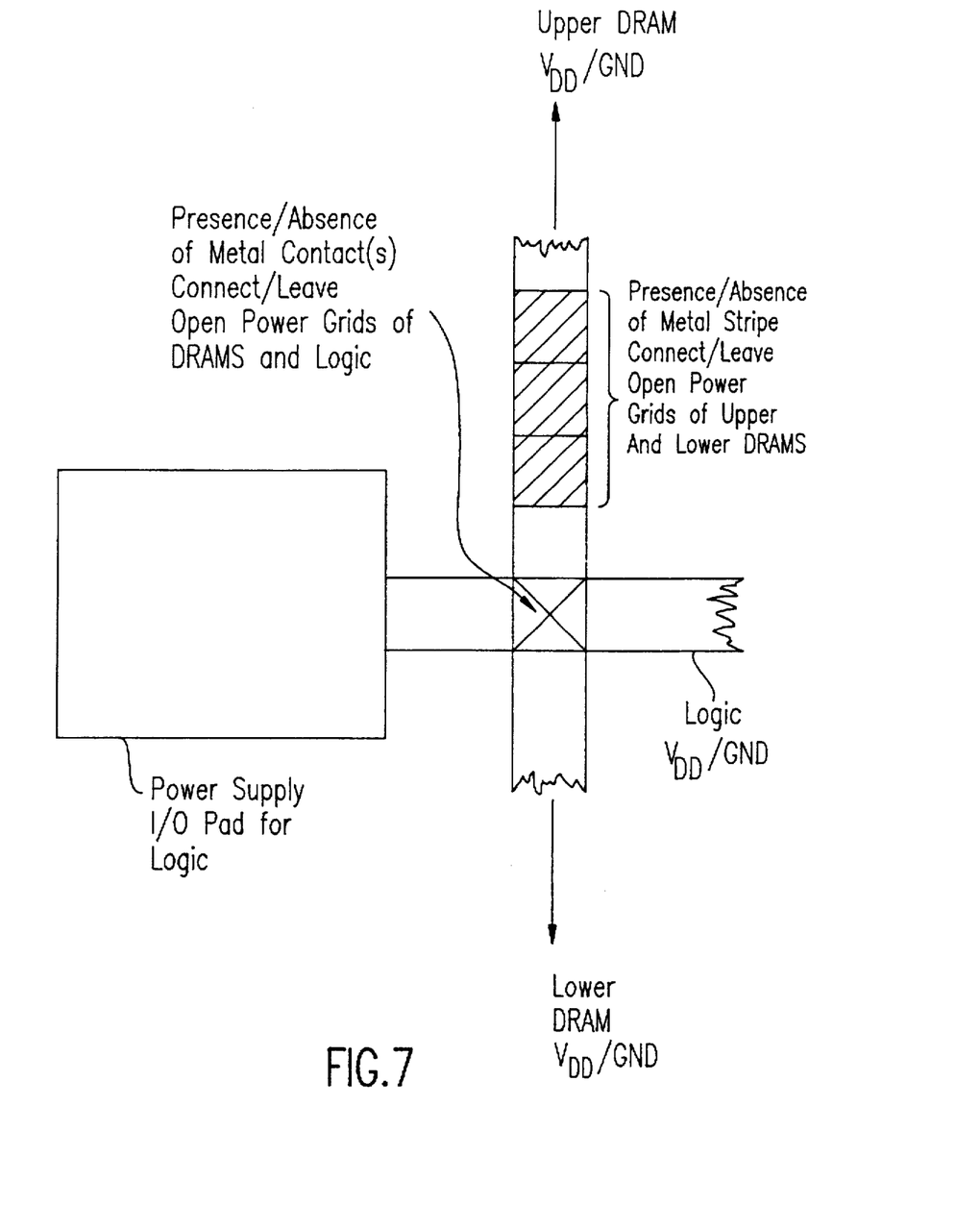
FIG. 7 is a block diagram of a programmable wiring structure for connecting or leaving open the DRAM macros and logic cores power grids.

The power grids for the SDRAM macros and logic cores can be easily connected together by introducing a programmable fuse between two adjacent contact pads. The structure of such fuses is shown in FIG. 6A and typically includes a polysilicon wire 61 as the fuse element between a pair of contact pads 62 and 63. In the alternative, a programmable anti-fuse in the form of a field effect transistor (FET) device 64 as shown in FIG. 6B can be used for testing purposes. In either case, a typical programmable wiring structure for connecting or leaving open the DRAM macros and logic cores power grids is shown in FIG. 7.

The chip relies for its high performance on the balanced clock distribution, control and address buses, the power grid distribution, the distribution of data across many independent internal banks, the capacity to have many outstanding transactions, and fast wide external I/O channels. The synchronization, fast random access and low clock skew in each SDRAM macro are enforced. The floor plan has the advantages of simplicity, symmetrical access, lower power dissipation and noise suppression.

The SDRAM macro UMM engine described and illustrated features a synchronous single-bank level or multi-bank level row access strobe (RAS) control, and supports 1/2/4/8/full page burst modes with 200 MHz operation. The number of I/Os obtained from the macro is sixty-four, which gives an ideal interleaving or prefetch architecture by combining two or more macros.

The PLL signals the gate array memory controller for synchronizing the control signals to the various macros. Data is received from outside the UMM engine or delivered to off-chip via the four multiplexers and buffers (MUX/

BUFF) controlled by the memory controller which sends the control signal and the address signal to the various DRAM macros and logic cores.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A merged dynamic random access memory/logic device on a single chip, comprising:

a first plurality of dynamic random access memory macros arranged on a first portion of the chip;

a second plurality of dynamic random access memory macros arranged on a second portion of the chip;

a plurality of logic cores on a central portion of the chip between the first and the second plurality of dynamic random access memory macros, one of the logic cores being a memory controller generating control and address signals to the plurality of dynamic random access memory macros;

an on-chip system clock and distribution network, the distribution network routing clock signals from the on-chip system clock to a center of the chip and then buffering and fanning out the clock signals through a balanced tree to drive the first and the second plurality of dynamic random access memory macros and the plurality of logic cores including the memory controller with no intrinsic clock skew;

parallel system buses arranged between the first plurality of dynamic random access memory macros on the first portion of the chip and the logic cores in the central portion of the chip and between the second plurality of dynamic random access memory macros on the second portion and the logic cores, for transferring data between said dynamic random access memory macros and said logic cores;

multiplexers and buffers at either ends of the parallel system buses for bi-directionally transferring data between said system buses and a multiplicity of off chip input/output drivers;

separate power distribution grids for the first and second plurality of dynamic random access memory macros and the plurality of logic cores and the on-chip system clock, the power distribution grids including a multiplicity of decoupling capacitor arrays separating the first and second plurality of dynamic random access memory macros from the plurality of logic cores to provide noise isolation for the dynamic random access memory macros from the logic cores and reduce di/dt effects of power supply fluctuation on chip performance; and a multiplicity of programmable wiring cell structures to selectively connect and disconnect the separate power distribution grids between one of said first and second plurality of dynamic random access memory macros and a second one of said first and second plurality of dynamic random access memory macros and between one of said first and second plurality of dynamic random access memory macros and said logic cores and on-chip system clock.

2. A merged dynamic random access memory/logic device as in claim 1 wherein said on-chip system clock includes a phase locked loop.

3. A merged dynamic random access memory/logic device as in claim 2 wherein the distribution network includes global clock drivers providing additional levels of buffering to local clock drivers, the clock signals being distributed over the chip using a plurality of metal layers with specific width and thickness to minimize clock skew.

4. A merged dynamic random access memory/logic device as in claim 3 wherein said metal layers have a width of 100 nm to 1100 nm and a thickness of 100 nm to 1100 nm.

5. A merged dynamic random access memory/logic device as in claim 3 wherein the control signals from the memory controller are distributed to the first and second plurality of dynamic random access memory macros by respective balanced tree structures so that the control signals are distributed with even timing.

6. A merged dynamic random access memory/logic device as in claim 1 wherein the dynamic random access memory macros are synchronous dynamic random access memory arrays.

7. A clock generation network for a merged dynamic random access memory and logic technology on a single chip, comprising an on-chip system clock including a phase locked loop, and a clock distribution network connected to the on-chip system clock and routing clock signals to a center of the chip then buffering and fanning out clock signals through a balanced tree of inverters and clock wires with specific width and thickness to drive a plurality of dynamic random access memory macros and a plurality of logic cores with no intrinsic clock skew, the clock distribution network including a multiplicity of main global clock drivers providing additional levels of buffering to local clock drivers, clock signals being distributed over the entire chip using a plurality of metal layers with specific width and thickness to minimize clock skew.

8. A clock generation network as in claim 7 wherein said clock wires have a width of 100 to 1100 nm and a thickness of 100 nm to 1100 nm, and said metal layers have a width of 100 to 1100 nm and a thickness of 100 nm to 1100 nm.

9. A merged dynamic random access memory and logic device technology on a single chip comprising:

a clock generation network comprising an on-chip system clock including a phase locked loop, and a clock distribution network connected to the on-chip system clock and routing clock signals to a center of the chip then buffering and fanning out clock signals through a balanced tree of inverters and clock wires with specific width and thickness to drive a plurality of dynamic random access memory macros and a plurality of logic cores with no intrinsic clock skew, the clock distribution network including a multiplicity of main global clock drivers providing additional levels of buffering to local clock drivers, clock signals being distributed over the entire chip using two or more metal layers with specific width and thickness to minimize clock skew; and control, address and data buses to multi-bank dynamic random access memory macros including balanced wirings from output drivers of control logic to corresponding inputs of different dynamic random access memory macros for the row access strobe, column access strobe, write enable signal, macro select signals, and the address decoder lines, in a way to minimize differences in address and control signal delay to the different dynamic random access memory macros.

10. A merged dynamic random access memory and logic device technology as in claim 9 wherein said clock wires have a width of 100 to 1100 nm and a thickness of 100 nm to 1100 nm, and said metal layers have a width of 100 to 1100 nm and a thickness of 100 nm to 1100 nm.

* * * * *